United States Patent
Schultheis et al.

(10) Patent No.: US 11,566,320 B2
(45) Date of Patent: Jan. 31, 2023

(54) NIW(X) SPUTTERING TARGET WITH IMPROVED STRUCTURE

(71) Applicant: Materion Advanced Materials Germany GmbH, Alzenau (DE)

(72) Inventors: Markus Schultheis, Flieden (DE); Martin Schlott, Offenbach (DE)

(73) Assignee: Materion Advanced Materials Germany GmbH, Alzenau (DE)

( * ) Notice: Subject to any disclaimer, the term of this patent is extended or adjusted under 35 U.S.C. 154(b) by 0 days.

(21) Appl. No.: 17/103,647

(22) Filed: Nov. 24, 2020

(65) Prior Publication Data

US 2021/0156023 A1 May 27, 2021

(30) Foreign Application Priority Data

Nov. 25, 2019 (EP) .................................... 19211145

(51) Int. Cl.
*C23C 14/34* (2006.01)

(52) U.S. Cl.
CPC ............................... *C23C 14/3414* (2013.01)

(58) Field of Classification Search
CPC .................................................. C23C 14/3414
See application file for complete search history.

(56) References Cited

U.S. PATENT DOCUMENTS 4,215,180 A * 7/1980 Misumi ................ H01J 1/18
313/311
2017/0357135 A1* 12/2017 Gillaspie .............. C01G 33/006

FOREIGN PATENT DOCUMENTS

AT 14 157 U1 5/2015
JP 2001342561 A * 12/2001

OTHER PUBLICATIONS

Machine Translation to Enboku (JP 2001-342561) published Dec. 2001 (Year: 2001).*
Lee et al., "Electrochromic Behavior of Ni—W Oxide Electrodes", Solar Energy Materials and Solar Cells, Elsevier Science Publishers, Amsterdam, NL, (Dec. 1, 1995), vol. 39, ISSN 0927-0248, pp. 155-166.

* cited by examiner

*Primary Examiner* — John J Brayton
(74) *Attorney, Agent, or Firm* — Cozen O'Connor

(57) ABSTRACT

The present invention relates to a sputtering target comprising Ni, W and, optionally, one or more further metal(s) X selected from the group of the refractory metals, Sn, Al and Si, which has a normalized peak intensity ratio $$PIR = I_{Ni}/I_{W}(A_{W}+A_{x})/A_{Ni}$$

of 0.40 or greater, wherein
$I_{Ni}$ is the intensity of the (111) peak of Ni,
$I_{W}$ is the intensity of the (110) peak of W,
$A_{w}$ is the fraction of W in the target in atom %,
$A_{x}$ is the total fraction of the one or more further metals selected from the group of the refractory metals, Sn, Al and Si in the target in atom %,
$A_{Ni}$ is the fraction of Ni in the target in atom %,
and wherein the intensities of the peaks are determined by X-ray powder diffraction using Cu-K$_{alpha}$ radiation.

6 Claims, No Drawings

NiW(X) SPUTTERING TARGET WITH IMPROVED STRUCTURE

This application claims priority to European Patent Application No. 19211145.8 filed on Nov. 25, 2019, the contents of all of which are fully incorporated by reference herein.

The present invention relates to a sputtering target comprising Ni, W and, optionally, one or more further metal(s) X selected from the group of the refractory metals, Sn, Al and Si.

NiW targets are used for electrochromic applications, recently especially in tubular form. For example, US 2017/0003564 A1 discloses the use of NiW(X)-oxide based counter electrodes for electrochromic glass, wherein X is an optional additional element, such as Ta or Nb.

AT14157U1 discloses the production of NiW sputtering targets by using a powder metallurgical route involving hot isostatic pressing (HIP) of powder blends at 1100 to 1450° C., and explicitly teaches away from using thermal spraying due to its alleged disadvantages. However, HIP and bonding of sleeves is expensive and results in segmented targets if the length of the target exceeds 0.5 m. Since NiW targets are used for oxygen reactive sputtering, the bond gaps due to the segmented target structure will result in re-deposits and arcing risk.

A possible further manufacturing technology for NiW(X) targets is plasma spraying of elemental powder blends. In such processes, however, a higher amount of oxygen than when using a HIP process is introduced into the target. Furthermore, straight forward spray processes result in cracks of the target material layer once a certain thickness (typically 3 to 4 mm) is exceeded. The stress in NiW(X) sprayed layers can be so high that the backing tubes gets distorted into an oval shape, once a crack is formed in the target layer.

It is thus the object of the present invention to provide an improved NiW(X) sputtering target material which allows the production of crack-free targets having an increased thickness in order to provide longer target life and, by this, a better up-time of the sputtering equipment. Furthermore, it is an object to provide a NiW(X) sputtering target material which allows the production of targets with increased length without bond gaps which would give rise to arcing problems.

The present invention therefore provides a sputtering target comprising Ni, W and, optionally, one or more further metal(s) X selected from the group of the refractory metals, Sn, Al and Si, which has a normalized peak intensity ratio $$PIR = I_{Ni}/I_W \cdot (A_W + A_x)/A_{Ni}$$

of 0.40 or greater, wherein $I_{Ni}$ is the intensity of the (111) peak of Ni,
$I_W$ is the intensity of the (110) peak of W,
$A_w$ is the fraction of W in the target in atom %,
$A_x$ is the total fraction of the one or more further metals selected from the group of the refractory metals, Sn, Al and Si in the target in atom %,
$A_{Ni}$ is the fraction of Ni in the target in atom %,
and wherein the intensities of the peaks are determined by X-ray powder diffraction using Cu-K$_{alpha}$ radiation.

The sputtering target of the invention can be manufactured to an increased thickness which provides a longer target life time at the user and showing reduced arcing during reactive sputtering. Furthermore, the risk during target manufacturing due to cracking is reduced and the production cost increase due to cracked and scrapped targets is minimized.

The sputtering target of the invention is obtainable by a thermal spraying process with improved deposition conditions as described hereinafter. Using the improved conditions, which cause the PIR of the targets of the invention, the thickness can typically be increased by 30 to 50%, i.e. one can obtain crack-free targets of more than 4 mm, preferably more than 5 mm thickness by plasma spraying.

Refractory metals in the sense of the present invention are Ti, V, Cr, Mn, Zr, Nb, Mo, Ru, Rh, Hf, Ta, Re, Os and Ir.

Preferably, the sputtering target according to the invention has a normalized peak intensity ratio which is 0.42 or greater, more preferably is 0.44 or greater, and still more preferably is 0.45 or greater.

For the embodiment in which the sputtering target contains a further metal X (e.g. Ta), i.e. the fraction of X is >0 at. %, the sputtering target preferably has a normalized peak intensity ratio which is 0.42 or greater, more preferably is 0.45 or greater, still more preferably is 0.46 or greater, and most preferably is 0.49 or greater.

Usually, the sputtering target according to the invention has a normalized peak intensity ratio which is not greater than 1.0 or not greater than 0.80.

The atomic ratio Ni/W in the sputtering target is preferably from 0.5 to 10, more preferably from 0.75 to 9 and most preferably from 1 to 8.

The optional further metal(s) X contained in the sputtering target in addition to Ni and W is/are preferably selected from the group of the refractory metals.

The optional further metal(s) X contained in the sputtering target in addition to Ni and W is/are more preferably selected from the group Ta, Nb and Mo, and most preferably X is Ta.

In a preferred embodiment, the sputtering target comprises, or consists of, Ni, W and one further metal X selected from the group of the refractory metals, Sn, Al and Si, more preferably the sputtering target comprises, or consists of, Ni, W and one metal X selected from the group of the refractory metals, still more preferably the sputtering target comprises, or consists of, Ni, W and one metal X selected from the group of Ta, Nb and Mo, and most preferably the sputtering target comprises, or consists of, Ni, W and one metal X being Ta.

In a further preferred embodiment the sputtering target consists of Ni and W.

Preferably, in the sputtering target according to the invention Ni is present in an amount of from 45 to 90 atom %, more preferably from 50 to 85 atom %.

In the preferred embodiment wherein the sputtering target comprises, or consists of, Ni, W and one or more metal(s) X in any of the embodiments as defined hereinbefore, Ni preferably is present in an amount of from 45 to 85 atom %, more preferably from 50 to 80 atom %.

In the preferred embodiment wherein the sputtering target consists of Ni and W, the atomic ratio Ni/W in the sputtering target is preferably from 0.5 to 10, more preferably from 0.75 to 8, and most preferably from 1 to 6.

Preferably, in the sputtering target according to the invention W is present in an amount of from 7 to 50 atom %, more preferably from 10 to 45 atom %, still more preferably from 12 to 40 atom %, and most preferably from 15 to 35 atom %.

In the preferred embodiment wherein the sputtering target comprises, or consists of, Ni, W and one or more metal(s) X in any of the embodiments as defined hereinbefore, W preferably is present in an amount of from 7 to 50 atom %, more preferably from 10 to 40 atom %, still more preferably from 12 to 35 atom %.

In the preferred embodiment wherein the sputtering target comprises, or consists of, Ni, W and one or more metal(s) X in any of the embodiments as defined hereinbefore, X preferably is present in an amount of from 3 to 20 atom %, more preferably from 5 to 17 atom %.

For example, in the preferred embodiment wherein the sputtering target consists of Ni, W and Ta, Ta preferably is present in an amount of from 3 to 20 atom %, more preferably from 5 to 17 atom %.

The sputtering target of the invention preferably has a thickness of greater than 4 mm, more preferably of greater than 5 mm.

Usually, the sputtering target of the invention has a thickness of not greater than 20 mm, or not greater than 10 mm.

The sputtering target of the invention preferably has a length of greater than 1 m, more preferably of greater than 1.5 m.

Usually, the sputtering target of the invention has a length of not greater than 4 m, or not greater than 3 m.

Usually, the sputtering target is a tubular target, in which the substrate has a tubular shape. As tubular substrate usually a nonmagnetic stainless steel tube is used.

The NiW(X) sputtering target of the invention can be produced in a process for forming a sputtering target comprises thermally spraying a powder mixture of the metals to be contained in the sputtering target at comparatively "cold" conditions such as exemplified in the examples.

Thus, for example, the heat addition to the powder in the spraying process can be kept comparatively small and/or for depositing the target layer on a substrate the temperature of the formed target layer can be selected to have a comparatively low temperature, such as 40° C. or smaller.

On the other hand the temperature should be >18° C. since the use of the sputtering target in the film deposition process results in a heating by the sputtering power. This heat results in thermal expansion of backing tube and target layer. Since the SST backing tube shows a stronger thermal expansion than the target layer a cracking risk is generated if the target layer has been deposited at a too low temperature during the plasma spraying process.

It is believed that during spraying of NiW(X) target layers a high amount of heat is released compared to spraying processes for products w/o Ni, so that prior art spraying processes result in stress in the sprayed NiW(X) target layer and may also introduce a high amount of intermetallic phases.

It is furthermore believed that with the modified spray process as exemplified in the examples the fraction of unreacted, i.e. elemental Ni (and W), could be increased in the produced sputtering target. It is assumed that also the volume fraction of intermetallic phases was reduced. These effects contribute to decrease the stress level in the formed targets so that thicker targets can be produced.

XRD pattern of both the improved and the prior art process do not reveal peaks which can be attributed to intermetallic phases, while SEM analysis clearly proves their presence on both cases. It is assumed that the fast quenching and short reaction times for the elemental metal droplets prevents a sufficient crystallization of the intermetallic zones in the target.

Thermal spraying may be performed using a burner output of 65 kW or below, and using a powder supply rate of 160 g/min or below.

Thermal spraying may performed at a powder supply rate/burner output rate of 2.45 g/(kW min) or higher, more preferably of 2.5 g/(kW min) or higher.

Preferably, the grain size of the powders used in the powder mixture for spaying is from 30 to 120 μm.

In the thermal spraying process used for the production of the NiW(X) sputtering target of the invention usually oxygen in amounts of several thousand up to 10,000 ppm is introduced into the target material. However, as the NiW(X) targets are used for forming oxidic layers by reactive sputtering in the presence of oxygen this is not disadvantageous.

Definitions/Measurement Methods a) Normalized Peak Intensity Ratio (PIR)

The PIR is determined by evaluation of Cu-K$_{alpha}$ XRD pattern of the produced target.

For this, the peak intensity I$_{Ni}$ of the strongest Ni line at 2Theta=44.5° with hkl=(111) is compared to the peak intensity I$_w$ of the strongest W line at 2Theta=40.3° with hkl=(110).

The normalized peak intensity ratio PIR is calculated in the following way:

$$PIR = I_{Ni}/I_W \cdot (A_W + A_x)/A_{Ni}$$

wherein

I$_{Ni}$ is the intensity of the (111) peak of Ni, I$_W$ is the intensity of the (110) peak of W, A$_w$ is the fraction of W in the target in atom %, A$_x$ is the total fraction of the one or more further metal(s) X selected from the group of the refractory metals, Sn, Al and Si, for example Ta, in the target in atom %, and A$_{Ni}$ is the fraction of Ni in the target in atom %.

There may be a shift between the elemental composition of the powder blend used for the production of the target and the target as such due to different deposition efficiencies of Ni and W, or the additional element(s) during the spraying process. To be clear: A$_{Ni}$, A$_x$ and A$_W$ refer to the actual target composition, which can e.g. be measured by ICP or XRF.

b) Measurement method for grain size of metal powders

Particle size distribution of dry metal powders was measured with laser diffraction, using the laser diffraction system "Fritsch ANALYSETTE 22 MicroTec plus" according to international standard ISO 13320 "Particle Size Analysis—Laser Diffraction Methods".

EXAMPLES

Several examples and comparative examples were performed in order to illustrate the invention. Spray powders were prepared by blending elemental powders in a tubular blender for 3 h. Typically, powders with a grain size range of 30 to 120 μm give suitable results. Especially for W too large grains should be avoided. These powder blends were used for plasma spraying on SST tubes with an OD of 133 mm and a length of 550 mm. The ends were covered by a mask ring.

In Table 1 the conditions for the thermal spraying of comparative Ni/W/Ta targets and such according to the present invention are listed.

TABLE 1

|  | Comparative process: Thermal spraying conditions resulting in cracked and oval shaped tubes | Process according to the invention: Thermal spraying conditions resulting in crack-free and in-spec round tubes |
| --- | --- | --- |
| Burner output (kW) | 69 ± 1 | 59 ± 1 |
| Powder supply rate (g/min) | 165 ± 5 | 150 ± 5 |
| Surface temperature*) (C. °) | >45 | 18 < T < 35 (controlled by intensive cooling) |
| Powder grain size (μm) | 45 to 90 | 45 to 90 |

*)The surface of the target tube is measured by a calibrated IR thermometer during deposition of the target layer. The measurement is taken 50 cm behind the spray zone by traveling together with the spray gun.

In the following Table 2, the properties of the targets of Examples 1 and 3 and that of Comparative Examples 2 and 4 are given. The targets of Examples 1 and 3 were produced using the spraying process of the invention and the targets of Comparative Examples 2 and 4 were produced using the comparative process, with the conditions of both processes as shown in Table 1.

The quality of the produced targets was assessed based on whether or not macroscopic cracks occurred along the target length and/or whether or not the backing tube showed ovality, and the results are also shown in Table 2:

"good" means: no macroscopic crack along the target length, and no ovality of backing tube Dia.133.0>±0.5 mm.

"bad" means: at least one macroscopic crack along the target length and/or ovality of backing tube Dia.133.0>±0.5 mm

TABLE 2

| | Ni (at. %) | W (at. %) | Ta (at. %) | $A_{Ni}/(A_W+A_{Ta})$ | $I_{Ni}$ | $I_W$ | $I_{Ni}/I_W$ | PIR | Target |
|---|---|---|---|---|---|---|---|---|---|
| 1 | 67.5 | 20.5 | 12 | 2.08 | 100 | 88.8 | 1.13 | 0.54 | good |
| CE2 | 67.5 | 20.5 | 12 | 2.08 | 78.6 | 100 | 0.79 | 0.38 | Bad |
| 3 | 75 | 25 | 0 | 3.00 | 100 | 67.9 | 1.47 | 0.49 | good |
| CE4 | 75 | 25 | 0 | 3.00 | 100 | 92.8 | 1.08 | 0.36 | Bad |

The invention claimed is:

1. Sputtering target consisting of Ni, W and one or more further metal(s) X selected from the group of the Ta, Nb and Mo in an amount of from 3 to 20 atom %, wherein the target has a normalized peak intensity ratio $$PIR=I_{Ni}/I_W(A_W+A_x)/A_{Ni}$$

of 0.40 or greater, wherein
$I_{Ni}$ is the intensity of the (111) peak of Ni,
$I_w$ is the intensity of the (110) peak of W,
$A_w$ is the fraction of W in the target in atom %,
$A_x$ is the total fraction of the one or more further metals in the target in atom %,
$A_{Ni}$ is the fraction of Ni in the target in atom %,
and wherein the intensities of the peaks are determined by X-ray powder diffraction using Cu-K$_{alpha}$ radiation.

2. Sputtering target according to claim 1 wherein the normalized peak ratio is 0.42 or greater.

3. Sputtering target according to claim 1 wherein the atom ratio Ni/W in the sputtering target is from 0.5 to 10.

4. Sputtering target according to claim 1 wherein the one or more further metal X is Ta.

5. Sputtering target according to claim 1 wherein Ni is present in an amount of from 45 to 90 atom %.

6. Sputtering target according to claim 1 wherein W is present in an amount of from 7 to 50 atom %.

* * * * *